United States Patent
Oh et al.

(10) Patent No.: US 11,312,103 B2
(45) Date of Patent: Apr. 26, 2022

(54) COMPOSITE THERMAL INSULATION SHEET INCLUDING AEROGEL

(71) Applicants: LG CHEM, LTD., Seoul (KR); LG ELECTRONICS INC., Seoul (KR)

(72) Inventors: Kyoung Shil Oh, Daejeon (KR); Je Kyun Lee, Daejeon (KR); Byoung Wook Han, Seoul (KR); Yong Seog Jeon, Gyeonggi-do (KR); Sang Woo Park, Daejeon (KR); Joong Nyon Kim, Seoul (KR)

(73) Assignees: LG Chem, Ltd., Seoul (KR); LG Electronics Inc., Seoul (KR)

( * ) Notice: Subject to any disclaimer, the term of this patent is extended or adjusted under 35 U.S.C. 154(b) by 168 days.

(21) Appl. No.: 16/631,375

(22) PCT Filed: Aug. 21, 2018

(86) PCT No.: PCT/KR2018/009608
§ 371 (c)(1),
(2) Date: Jan. 15, 2020

(87) PCT Pub. No.: WO2019/107706
PCT Pub. Date: Jun. 6, 2019

(65) Prior Publication Data
US 2020/0215791 A1     Jul. 9, 2020

(30) Foreign Application Priority Data
Nov. 28, 2017   (KR) .......... 10-2017-0160077

(51) Int. Cl.
*B32B 5/18* (2006.01)
*B32B 5/02* (2006.01)
*B32B 5/26* (2006.01)
*B32B 33/00* (2006.01)

(52) U.S. Cl.
CPC ............ *B32B 5/18* (2013.01); *B32B 5/022* (2013.01); *B32B 5/26* (2013.01); *B32B 33/00* (2013.01); *B32B 2262/101* (2013.01); *B32B 2264/102* (2013.01); *B32B 2266/126* (2016.11); *B32B 2307/304* (2013.01)

(58) Field of Classification Search
CPC .. B32B 5/18; B32B 5/022; B32B 5/26; B32B 2262/101; B32B 2307/304
USPC ........................................................ 428/201
See application file for complete search history.

(56) References Cited

U.S. PATENT DOCUMENTS

| | | | |
|---|---|---|---|
| 8,021,583 B2 | 9/2011 | Rouanet et al. | |
| 8,734,931 B2 | 5/2014 | Seth et al. | |
| 9,707,737 B2 | 7/2017 | Nakamura et al. | |
| 2005/0046086 A1 | 3/2005 | Lee et al. | |

(Continued)

FOREIGN PATENT DOCUMENTS

| CN | 101795857 | 8/2010 |
|---|---|---|
| CN | 105704981 | 6/2016 |

(Continued)

*Primary Examiner* — Betelhem Shewareged
(74) *Attorney, Agent, or Firm* — Dentons US LLP

(57) ABSTRACT

Provided is a composite thermal insulation sheet including an aerogel and a method for manufacturing the same. The methods yield an ultra-thin aerogel composite sheet having characteristics of low dust, high strength and high thermal insulation, thereby having an increased applicability thereof to an electronic device.

11 Claims, 1 Drawing Sheet

(56) References Cited

U.S. PATENT DOCUMENTS

| | | |
|---|---|---|
| 2005/0100728 A1 | 5/2005 | Ristic-Lehmann et al. |
| 2005/0143515 A1 | 6/2005 | Ristic-Lehmann et al. |
| 2005/0167891 A1 | 8/2005 | Lee et al. |
| 2006/0125158 A1 | 6/2006 | Rouanet et al. |
| 2006/0196689 A1 | 9/2006 | Ristic-Lehmann et al. |
| 2006/0196690 A1 | 9/2006 | Ristic-Lehmann et al. |
| 2006/0240237 A1 | 10/2006 | Ristic-Lehmann et al. |
| 2007/0004306 A1* | 1/2007 | Leeser ............... E04B 1/625 442/394 |
| 2007/0173157 A1* | 7/2007 | Trifu ................ B32B 27/285 442/286 |
| 2007/0176282 A1 | 8/2007 | Ristic-Lehmann et al. |
| 2008/0093016 A1 | 4/2008 | Lee et al. |
| 2008/0105373 A1 | 5/2008 | Ristic-Lehmann et al. |
| 2008/0131683 A1 | 6/2008 | Ristic-Lehmann et al. |
| 2009/0029109 A1 | 1/2009 | Seth et al. |
| 2010/0140840 A1 | 6/2010 | Rouanet et al. |
| 2011/0252739 A1 | 10/2011 | Leeser et al. |
| 2014/0273701 A1 | 9/2014 | Samanta et al. |
| 2016/0003404 A1 | 1/2016 | Shibata et al. |
| 2016/0016378 A1 | 1/2016 | Oikawa et al. |
| 2016/0167340 A1 | 6/2016 | Nakamura et al. |
| 2016/0333572 A1 | 11/2016 | Samanta et al. |
| 2017/0197378 A1 | 7/2017 | Abe et al. |
| 2018/0022061 A1 | 1/2018 | Kotake et al. |
| 2018/0086587 A1 | 3/2018 | Kim et al. |
| 2019/0263089 A1 | 8/2019 | Kotake et al. |
| 2020/0215791 A1* | 7/2020 | Oh .................. D06M 13/513 |

FOREIGN PATENT DOCUMENTS

| | | |
|---|---|---|
| EP | 3034290 A1 | 6/2016 |
| JP | H10-139561 | 5/1998 |
| JP | H11-211357 | 8/1999 |
| JP | 2002307413 | 10/2002 |
| JP | 2010-534188 | 11/2010 |
| JP | 2013139150 | 7/2013 |
| JP | 2015068465 A | 4/2015 |
| JP | 2016-028880 | 3/2016 |
| JP | 2016-112757 | 6/2016 |
| KR | 10-20070052269 | 5/2007 |
| KR | 10-20120012836 | 2/2012 |
| KR | 10-20120122797 | 11/2012 |
| KR | 10-20150122196 | 10/2015 |
| KR | 10-20170109565 | 9/2017 |
| WO | 2009-014913 | 1/2009 |
| WO | 2014132652 | 9/2014 |
| WO | 2016-072093 | 5/2016 |
| WO | 2017126784 | 7/2017 |

\* cited by examiner

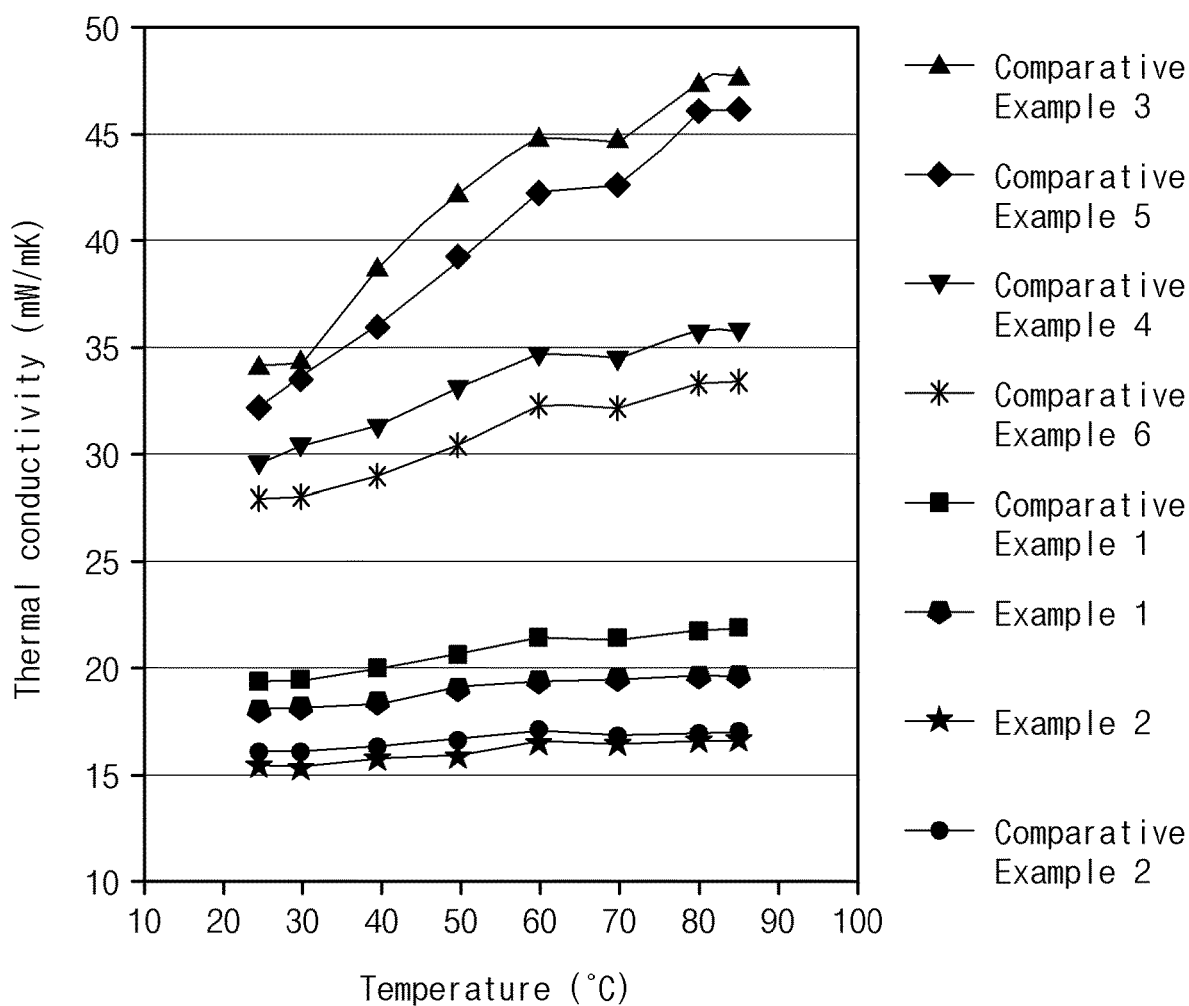

COMPOSITE THERMAL INSULATION SHEET INCLUDING AEROGEL

CROSS-REFERENCE TO RELATED APPLICATIONS

This application is a National Stage Application of International Application No. PCT/KR2018/009608 filed Aug. 21, 2018, which claims the benefit of Korean Patent Application No. 10-2017-0160077, filed on Nov. 28, 2017, in the Korean Intellectual Property Office, the disclosure of which is incorporated herein in its entirety by reference.

TECHNICAL FIELD

The present invention relates to a composite thermal insulation sheet including aerogel and a method for manufacturing the same.

BACKGROUND

Electronic products such as notebooks, OLEDs, and TVs have hot spots generated by heat sources, so that the sensibility of consumers may be deteriorated due to partial heat release on the surface of a device. In addition, when not properly diffused to the outside by using a simple thermal insulation material, excessively accumulated heat may cause failure of a system, shorten the lifespan of a product, or cause explosion or fire in severe cases. Various thermal insulation materials have been applied to solve such problems caused by heat generation. However, an optimal thermal insulation material which is thin and excellent in thermal insulation performance has not been developed so far. Therefore, various studies and technology developments are being still conducted.

In order to solve such typical problems, the present invention attempts to solve the above problems by applying aerogel which is attracting attention as a thermal insulation material of high efficiency.

Aerogel is a highly porous material composed of nanoparticles, and has high porosity, specific surface area, and low thermal conductivity, thereby attracting attention as a thermal insulation material, a soundproofing material and the like of high efficiency.

Meanwhile, since aerogel has very low mechanical strength due to the porous structure thereof, an aerogel composite is prepared and used, the aerogel composite obtained by impregnating a fiber such as an inorganic fiber or an organic fiber, which is a conventional heat insulating fiber, with aerogel. However, such aerogel composite has poor adhesion between the fiber and the aerogel so that aerogel particles are separated during a processing process such as cutting and bending causing generation of dust and durability deterioration, which may result in equipment damage when applied as a thermal insulating material for an electronic product and the like.

Therefore, in order to solve the above problems, the present invention provides an aerogel composite sheet having characteristics of low dust, high strength, and high thermal insulation to enhance the applicability thereof to an electronic device.

PRIOR ART DOCUMENT (Patent Document 1) U.S. Pat. No. 8,021,583 B2 (Sep. 9, 2011)

DISCLOSURE OF THE INVENTION

Technical Problem

An aspect of the present invention provides an ultra-thin composite thermal insulation sheet having characteristics of low dust, high strength and high thermal insulation so as to be utilized in electronic devices, and a method for manufacturing the same.

Technical Solution

According to an aspect of the present invention, provided is a composite thermal insulation sheet including an aerogel sheet, a sol-impermeable coating layer formed on one surface of the aerogel sheet, and one or more functional layers formed on the other surface of the aerogel sheet.

According to another aspect of the present invention, provided is a method for manufacturing a composite thermal insulation sheet, the method comprising forming a sol-impermeable coating layer on one surface of a fiber sheet, impregnating the other surface of the fiber sheet with a sol and a catalyst, forming a wet gel sheet by gelling the impregnated sheet, forming an aerogel sheet by drying the wet gel sheet, and forming one or more functional layers on the aerogel sheet.

Advantageous Effects

According to a composite thermal insulation sheet of the present invention, dust generation is reduced by a sol-impermeable coating layer formed on one surface, so that high thermal insulation efficiency and processing convenience may be provided.

In addition, according to a composite thermal insulation sheet of the present invention, mechanical strength is improved by the coating layer, so that durability may be increased.

In addition, according to a composite thermal insulation sheet of the present invention, other necessary functions may be secured by the functional layer.

BRIEF DESCRIPTION OF THE DRAWINGS

The following drawings attached herein illustrate preferred embodiments of the present invention by example, and serve to enable technical concepts of the present invention to be further understood together with detailed description of the invention given below, and therefore the present invention should not be interpreted only with matters in such drawings.

FIG. 1 is a graph showing the thermal conductivity of the composite thermal insulation sheet of Examples and Comparative Examples.

MODE FOR CARRYING OUT THE INVENTION

Hereinafter, the present invention will be described in more detail to facilitate understanding of the present invention. In this case, it will be understood that words or terms used in the specification and claims shall not be interpreted as having the meaning defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

In general, electronic products may have hot spots generated by heat sources, so that the quality may be deteriorated due to partial heat release on the surface of a device. Accordingly, the present invention intends to use an aerogel sheet as a thermal insulation material of high efficiency.

However, the aerogel sheet has poor adhesion between a fiber and aerogel so that aerogel particles are separated during a processing process such as cutting and bending, and has poor strength causing durability deterioration. Therefore, there is a limit to the application thereof as a thermal insulation material to an electronic product and the like.

Therefore, an aspect of the present invention provides an ultra-thin composite thermal insulation sheet having characteristics of low dust, high strength and high thermal insulation so as to be widely utilized in electronic products, and a method for manufacturing the same.

Hereinafter, a composite thermal insulation sheet of the present invention and a method for manufacturing the same will be described in detail.

According to an aspect of the present invention, provided is a composite thermal insulation sheet including an aerogel sheet, a sol-impermeable coating layer formed on one surface of the aerogel sheet, and one or more than one functional layer formed on the other surface of the aerogel sheet.

In order to reduce the generation of dust, which has been a typical problem, the composite thermal insulation sheet of the present invention is characterized by introducing a sol-impermeable coating layer on one surface of an aerogel sheet.

Specifically, the coating layer includes one or more than one polymer selected from the group consisting of Polyamide (PA), Polyethylene (PE), Polyethylene Terephthalate (PET), Polyimide (PI) and silicon.

The coating layer is particularly characterized in being sol-impermeable. The coating layer of the present invention prevents sol from penetrating a fiber and flowing outward when the sol is impregnated into the organic or inorganic fiber during the preparation process of an aerogel sheet, so that aerogel is prevented from being exposed to the surface of the aerogel sheet, and a low dust characteristic is achieved. Meanwhile, the other surface on which the coating layer is not formed may prevent aerogel from being exposed to the outside by means of functional layers to be described layer.

In addition, the coating layer may serve to complement mechanical strength of the aerogel sheet, which is very low due to the porous structure of aerogel. The coating layer may improve durability by increasing the mechanical strength of a composite thermal insulation sheet.

Meanwhile, the thickness of the sol-impermeable coating layer of the present invention is 30 μm or less, more specifically 10 to 20 μm. When the thickness of the sol-impermeable coating layer is greater than the above range, the thermal insulation performance of a composite thermal insulation material may be deteriorated, and there may be a limitation to the application thereof to an electronic product which requires an ultra-thin thermal insulation material. On the other hand, when the thickness is less than the above range, the effect of improving mechanical strength is insignificant so that durability may not be good.

In the present invention, a material capable of forming the sol may include one or more inorganic materials selected from the group consisting of zirconia, yttrium oxide, hafnia, alumina, titania, ceria, silica, magnesium oxide, calcium oxide, magnesium fluoride and calcium fluoride.

In addition, the sol can include an alkoxide-based compound containing silicon, specifically, tetraalkyl silicate such as tetramethyl orthosilicate (TMOS), tetraethyl orthosilicate (TEOS), prehydrolyzed TEOS, methyl triethyl orthosilicate, dimethyl diethyl orthosilicate, tetrapropyl orthosilicate, tetraisopropyl orthosilicate, tetrabutyl orthosilicate, tetra secondary butyl orthosilicate, tetra tertiary butyl orthosilicate, tetrahexyl orthosilicate, tetracyclohexyl orthosilicate, and tetradodecyl orthosilicate.

In addition, an alcohol which can be used in the production of the silica sol of the present invention can specifically be a monohydric alcohol such as methanol, ethanol, isopropanol, and butanol; or a polyhydric alcohol such as glycerol, ethylene glycol, propylene glycol, diethylene glycol, dipropylene glycol, and sorbitol, and any one or a mixture of two or more thereof can be used. When considering the miscibility thereof with water and an aerogel, the alcohol can be a monohydric alcohol having 1 to 6 carbon atoms such as methanol, ethanol, isopropanol, and butanol. The above alcohol (polar organic solvent) can be used in an appropriate amount in consideration of the degree of hydrophobicity of the finally produced silica aerogel while promoting the surface modification reaction.

In addition, the composite thermal insulation sheet of the present invention can include one or more functional layers on the other surface of the aerogel sheet.

Meanwhile, when an electronic product is not capable of properly diffusing heat generated by using a simple thermal insulation material to the outside, excessively accumulated heat may cause failure of a system, shortens the lifespan of the product, or causes explosion or fire in severe cases.

Accordingly, the present invention provides a composite thermal insulation layer in which a functional layer is laminated on the other surface on which the sol-impermeable coating layer of the composite thermal insulation sheet is not formed, thereby having excellent thermal insulation performance and preventing damage to a device since there is no dust generated. Furthermore, the composite thermal insulation layer according to the present invention has a structural feature in which heat accumulation in a device is prevented due to thermal insulation, thereby preventing damage to the device.

Specifically, the functional layer can exhibit one or more functions selected from the group consisting of thermal diffusion, insulation, sound absorption, vibration resistance, impermeability to water and permeability to water vapor, and the composite thermal insulating sheet of the present invention can include a functional layer which is not limited thereto, and can exhibit functions required in an electronic product to be used for.

Meanwhile, when the functional layer is impermeable to water, the composite thermal insulation sheet of the present invention can prevent water from penetrating into an electronic component to prevent damage to the electronic component, and when permeable to water vapor, the electronic component may be prevented from being damaged since the water vapor is prevented from being condensed in the electronic component. The layer that is impermeable to water and permeable to water vapor can include a cellulose material.

In an aerogel sheet included in the composite thermal insulation sheet of the present invention, the sheet can use an inorganic fiber, an organic fiber, or a combination thereof.

More specifically, the sheet can be a film, a sheet, a net, a fiber, a porous body, a foam, a non-woven body, or a laminate of two or more layers thereof. In addition, according to the use, surface roughness can be formed or patterned on the surface thereof. The sheet can be a fiber capable of further improving the thermal insulation performance by including a space or a void through which a sol can be easily inserted into the sheet. Also, the sheet of the present invention can preferably have low thermal conductivity.

Specifically, a fiber sheet usable in the present invention can be polyamide, polybenzimidazole, polyaramid, an acryl resin, a phenol resin, polyester, polyetheretherketone (PEEK), polyolefin (for example, polyethylene, polypropylene, or a copolymer thereof, and the like), cellulose, carbon, cotton, wool, hemp, a non-woven fabric, a glass fiber, or ceramic wool.

Meanwhile, the thickness of the aerogel sheet of the present invention is 3 mm or less, specifically 2 mm or less, more specifically 1 mm or less. When the thickness of the aerogel sheet is greater than the above range, there may be a limitation to the application thereof to an electronic product which requires an ultra-thin thermal insulation material, and when the thickness is less than the above range, durability may be deteriorated due to very low mechanical strength and thermal insulation performance may not be good.

In addition, the thickness of the composite thermal insulation sheet of the present invention is 3 mm or less, specifically 2 mm or less, more specifically 1 mm or less. When the thickness of the composite thermal insulation sheet is greater than the above range, the application thereof to an electronic product which requires an ultra-thin thermal insulation material may be difficult, and when the thickness is less than the above range, processability may be deteriorated.

In addition, the present invention provides a method for manufacturing the composite thermal insulation sheet.

Specifically, the method for manufacturing the composite thermal insulation sheet of the present invention includes forming a sol-impermeable coating layer on one surface of a fiber sheet, impregnating the other surface of the fiber sheet with a sol and a catalyst, forming a wet gel sheet by gelling the impregnated sheet, forming an aerogel sheet by drying the wet gel sheet, and forming one or more functional layers on the aerogel sheet.

More specifically, the sol-impermeable coating layer can be formed by placing a fiber on the coating layer on which a release paper is attached and then performing heat treatment.

In this case, the release paper is material to protect an adhesive surface by bringing into contact with the adhesive surface of an adhesive tape, an adhesive paper, a label or the like, and is peeled off to achieve the purpose thereof when used.

In the method for forming the sol-impermeable coating layer of the present invention, the release paper is used to fundamentally prevent aerogel from being exposed to the surface of the aerogel sheet.

Specifically, in the case in which a coating layer is formed on one surface of a fiber sheet without the release paper, and then a solution including a sol and a catalyst is impregnated on the other surface of the fiber sheet, when the solution is excessive to an extent that the fiber sheet is not able to incorporate all of the solution, an aerogel is formed on the surface of the coating layer by the sol flowing over the fiber sheet so that the coating layer is contaminated, and in this case, the coating layer may not sufficiently prevent dust generation.

Therefore, in the method for manufacturing a composite thermal insulation sheet of the present invention, a releasing paper including a coating material is prepared, and then a fiber is placed on the coating material followed by heat treatment to form a coating layer on one surface of the fiber sheet. Next, the release paper attached to the coating layer is removed after the completion of gelation to prevent the surface of the coating layer from being contaminated.

Thereafter, a sol and a catalyst are impregnated into the other surface of the fiber sheet, and the impregnated sheet is gelled to form a wet gel sheet.

The catalyst of the present invention promotes gelation by increasing the pH of a sol, and specifically, a basic catalyst can be used.

The basic catalyst can be an inorganic base such as sodium hydroxide and potassium hydroxide; or an organic base such as ammonium hydroxide. However, in the case of an inorganic base, a metal ion included in a compound can be coordinated to a Si—OH compound. Thus, an organic base may be preferred. Specifically, the organic base can be ammonium hydroxide ($NH_4OH$), tetramethylammonium hydroxide (TMAH), tetraethyl ammonium hydroxide (TEAH), tetrapropylammonium hydroxide (TPAH), tetrabutylammonium hydroxide (TBAH), methylamine, ethylamine, isopropylamine, monoisopropylamine, diethylamine, diisopropylamine, dibutylamine, trimethylamine, triethylamine, triisopropylamine, tributylamine, choline, monoethanolamine, diethanolamine, 2-aminoethanol, 2-(ethylamino) ethanol, 2-(methylamino) ethanol, N-methyl-diethanolamine, dimethylaminoethanol, diethylamino-ethanol, nitrilotriethanol, 2-(2-aminoethoxy)ethanol, 1-amino-2-propanol, triethanolamine, monopropanolamine, or dibutanolamine, and any one or a mixture of two or more thereof can be used. More specifically, the base of the present invention can be ammonium hydroxide ($NH_4OH$).

Meanwhile, the present invention can further include an aging step in which silica gel is left at an appropriate temperature such that the chemical change thereof can be completely achieved to enhance mechanical stability, and thereafter, can further include a surface modification step in which the surface of the gel is hydrophobized to suppress the absorption of moisture in the air so that low thermal conductivity is maintained.

Thereafter, the wet gel sheet can be dried to form an aerogel sheet, and the drying can be performed by atmospheric pressure drying or supercritical drying.

Finally, one or more functional layers can be formed on the aerogel sheet, thereby forming a composite thermal insulation sheet including an aerogel sheet having a sol-impermeable coating layer formed on one surface thereof and a functional layer formed on the other surface thereof.

Hereinafter, examples of the present invention will be described in detail so that those skilled in the art can easily carry out the present invention. The present invention may, however, be embodied in many different forms and is not limited to the examples set forth herein.

Example 1

Polyethylene terephthalate (organic fiber) was placed on a polyamide film including a release paper and then heat treated at 150° C. to prepare a polyethylene terephthalate having a polyamide coating layer formed on one surface thereof.

Next, tetraethyl orthosilicate, ethanol, water and HCl were mixed to prepare Pre-hydrolyzed TEOS (HTEOS) having a silica concentration of 20%, and the HTEOS, ethanol and water were mixed in a weight ratio of 1:2.25:0.35 to prepare a silica sol having a silica ($SiO_2$) concentration of 4%.

The silica sol and a base catalyst solution (weight ratio of ethanol:ammonia water=of 210:1, 0.44 wt % based on HTEOS) were sprayed on the other surface on which the polyamide coating layer of polyethylene terephthalate is not formed, and then gelation was induced to produce a wet gel sheet. It took about 10 minutes to complete the gelation. Meanwhile, at this time, it was confirmed that the silica sol could not pass through the coating layer. After the gelation was completed, the release paper was removed, and the wet gel sheet was left in an ammonia solution (2-3 vol %) of 80 to 90% based on the volume of the silica sol at a temperature of 50 to 70° C. for 1 hour to be aged, and then was left in a hexamethyldisilazane (HMDS) solution (2-10 vol %) of 80 to 90% based on the volume of the silica sol at a temperature of 50 to 70° C. for 4 hours to perform a hydrophobic reaction. After the hydrophobic reaction was completed, the silica wet gel was placed in a supercritical extractor of 7.2 L and $CO_2$ was injected thereto. Thereafter, upon reaching 50° C. and 100 bar, $CO_2$ was injected at a rate of 0.4 L/min and ethanol was extracted and dried. After the drying was completed, $CO_2$ was vented to produce an aerogel sheet.

A graphite sheet was attached to the aerogel sheet as a thermal diffusion material to manufacture a composite thermal insulation sheet.

Example 2

A composite thermal insulation sheet was manufactured in the same manner as in Example 1 except that a glass fiber (inorganic fiber) was used instead of polyethylene terephthalate (organic fiber).

Comparative Example 1

A composite thermal insulation sheet was manufactured in the same manner as in Example 1 except that a coating layer was not formed.

Comparative Example 2

A composite thermal insulation sheet was manufactured in the same manner as in Example 2 except that a coating layer was not formed.

Comparative Example 3

Polyethylene terephthalate having a polyamide coating layer was prepared in the same manner as in Example 1.

Comparative Example 4

A glass fiber having a poly amide coating layer was prepared in the same manner as in Example 2.

Comparative Example 5

A polyethylene terephthalate sheet of the Example 1 was prepared.

Comparative Example 6

A glass fiber sheet of the Example 2 was prepared.

TABLE 1

| | Whether aerogel is included or not | Type of fiber | Whether coating layer is included or not |
|---|---|---|---|
| Example 1 | ○ | Polyethylene terephthalate | ○ |
| Example 2 | ○ | Glass fiber | ○ |
| Comparative Example 1 | ○ | Polyethylene terephthalate | X |
| Comparative Example 2 | ○ | Glass fiber | X |
| Comparative Example 3 | X | Polyethylene terephthalate | ○ |
| Comparative Example 4 | X | Glass fiber | ○ |
| Comparative Example 5 | X | Polyethylene terephthalate | X |
| Comparative Example 6 | X | Glass fiber | X |

Experimental Example 1: Dust Generation Measurement

Each of the composite thermal insulation sheets manufactured in Examples 1 and 2 and Comparative Examples 1 and 2 was cut to a size of 12 cm×12 cm to prepare a sample. The weight reduction rate caused by vibration was measured under vibration conditions of 24 Hz/3 mm and 6 hours using a self-manufactured vibration tester (ASTMC592-04). The results are shown in Table 2 below.

Weight reduction rate (%)=[(initial weight of composite thermal insulation sheet−weight of composite thermal insulation sheet after vibration test)/(initial weight of composite thermal insulation sheet)]×100.

TABLE 2

| | Example 1 | Example 2 | Comparative Example 1 | Comparative Example 2 |
|---|---|---|---|---|
| Weight reduction rate (%) | 0.0 | 0.0 | 0.32 | 0.35 |

As shown in Table 2, the composite thermal insulation sheets of the embodiment showed no weight reduction. Therefore, it can be seen that there was almost no dust generation.

It can be expected that this is due to the sol-impermeable coating layer formed on one surface of the aerogel sheet included in the composite thermal insulation sheet of the present invention.

Experimental Example 2: Thermal Conductivity Measurement

The room temperature thermal conductivity was measured using a Heat Flow Meter (HFM) 456 of NETZSCH Co. for each of the aerogel sheets prepared in Examples 1 and 2 and Comparative Examples 1 and 2 and Comparative Examples 3 to 6, and the results are shown in Table 3 and FIG. 1.

TABLE 3

|  | Example 1 | Example 2 | Comparative Example 1 | Comparative Example 2 | Comparative Example 3 | Comparative Example 4 | Comparative Example 5 | Comparative Example 6 |
|---|---|---|---|---|---|---|---|---|
| Room temperature thermal conductivity (mW/mK, 25° C.) | 17.9 | 16.0 | 19.3 | 15.5 | 34.0 | 29.9 | 32.5 | 28.3 |

As shown in Table 3 and FIG. 1, the polyethylene terephthalate (PET) organic fiber not including the aerogel of Comparative Example 5 and the glass fiber (GF) inorganic fiber not including the aerogel of Comparative Example 6 have very high thermal conductivity when compared with the embodiment of the present invention. Therefore, it can be seen that the fiber sheet alone does not have excellent thermal insulation performance.

Meanwhile, in the case of Comparative Examples 3 in which a coating layer was formed for each of Comparative Examples 5 and 6, the thermal conductivity was rather increased. Therefore, it can be seem that the thermal insulation performance was deteriorated.

On the other hand, it was confirmed that the composite thermal insulation sheets of Examples 1 and 2 of the present invention had very low thermal conductivity, thereby having excellent thermal insulating performance. The thermal conductivity of the present invention was equal to or lower that of Comparative Examples 1 and 2 in which a coating layer was not formed. It can be seen that there was no increase in thermal conductivity due to the formation of the coating layer.

Therefore, it can be seen that the composite thermal insulation sheet of the present invention is capable of securing characteristics of low dust and high strength while preventing the deterioration of the thermal insulation performance.

The foregoing description of the present invention has been presented for purposes of illustration. It will be understood by those skilled in the art that various changes in form and details may be made therein without departing from the spirit and scope of the invention. It is therefore to be understood that the above-described embodiments are illustrative in all aspects and not restrictive.

The invention claimed is:

1. A composite thermal insulation sheet comprising:
an aerogel sheet;
a coating layer impermeable to a sol formed on one surface of the aerogel sheet; and
one or more functional layers formed on the other surface of the aerogel sheet,
wherein a thickness of the coating layer is from 30 μm or less, and
wherein a thickness of the composite thermal insulation sheet is 3 mm or less.

2. The composite thermal insulation sheet of claim 1, wherein the coating layer comprises one or more than one polymer selected from the group consisting of Polyamide (PA), Polyethylene (PE), Polyethylene Terephthalate (PET), Polyimide (PI) and silicone.

3. The composite thermal insulation sheet of claim 1, wherein the sol comprises one or more than one material selected from the group consisting of zirconia, yttrium oxide, hafnia, alumina, titania, ceria, silica, magnesium oxide, calcium oxide, magnesium fluoride and calcium fluoride.

4. The composite thermal insulation sheet of claim 1, wherein the functional layer exhibits one or more functions selected from the group consisting of thermal diffusion, insulation, sound absorption, vibration resistance, impermeability to water and permeability to water vapor.

5. The composite thermal insulation sheet of claim 1, wherein the aerogel sheet comprises an inorganic fiber, an organic fiber, or a combination thereof.

6. The composite thermal insulation sheet of claim 1, wherein the thickness of the sol-impermeable coating layer is 10 μm to 30 μm.

7. The composite thermal insulation sheet of claim 1, wherein the thickness of the aerogel sheet is 2 mm or less.

8. A method for manufacturing a composite thermal insulation sheet, the method comprising:
forming a sol-impermeable coating layer on one surface of a fiber sheet;
impregnating the other surface of the fiber sheet with a sol and a catalyst to form an impregnated sheet;
forming a wet gel sheet by gelling the impregnated sheet;
forming an aerogel sheet by drying the wet gel sheet; and
forming one or more functional layers on the aerogel sheet,
wherein the sol comprises one or more than one material selected from the group consisting of zirconia, yttrium oxide, hafnia, alumina, titania, ceria, silica, magnesium oxide, calcium oxide, magnesium fluoride and calcium fluoride,
wherein a thickness of the coating layer is from 30 μm or less, and
wherein a thickness of the composite thermal insulation sheet is 3 mm or less.

9. The method of claim 8, wherein the one or more functional layers are formed on the other surface on which the sol-impermeable coating layer of the composite thermal insulation sheet is not formed.

10. The method of claim 8, wherein the sol-impermeable coating layer is formed on one surface of the fiber sheet by placing a fiber on a coating material of a release paper comprising the coating material and then performing a heat treatment.

11. The method of claim 10 further comprising removing the release paper from the coating layer after the completion of gelation.

* * * * *